United States Patent [19]
Ibok et al.

[11] Patent Number: 6,025,228
[45] Date of Patent: Feb. 15, 2000

[54] METHOD OF FABRICATING AN OXYNITRIDE-CAPPED HIGH DIELECTRIC CONSTANT INTERPOLYSILICON DIELECTRIC STRUCTURE FOR A LOW VOLTAGE NON-VOLATILE MEMORY

[75] Inventors: Effiong Ibok, Sunnyvale; Yue-Song He, San Jose, both of Calif.

[73] Assignee: Advanced Micro Devices, Inc., Sunnyvale, Calif.

[21] Appl. No.: 08/978,398

[22] Filed: Nov. 25, 1997

[51] Int. Cl.[7] .................................................. H01L 21/70
[52] U.S. Cl. ........................ 438/261; 438/287; 438/591
[58] Field of Search ................... 438/264, 261, 438/216, 287, 591, 785, 240

[56] References Cited

U.S. PATENT DOCUMENTS

| | | |
|---|---|---|
| 5,248,629 | 9/1993 | Muroyama ................................ 437/52 |
| 5,290,609 | 3/1994 | Horiike .................................... 427/576 |
| 5,663,088 | 9/1997 | Sandhu .................................... 438/396 |
| 5,834,353 | 11/1998 | Wu ........................................ 438/287 |
| 5,876,788 | 3/1999 | Bronner ................................... 427/81 |

FOREIGN PATENT DOCUMENTS 405335483  12/1993  Japan .

OTHER PUBLICATIONS

Wolf, Stanley, Silicon Processing for the VLSI Era vol. 2, pp. 274–275, 1990.

*Primary Examiner*—Charles Bowers
*Assistant Examiner*—Matthew Whipple
*Attorney, Agent, or Firm*—Fliesler, Dubb, Meyer & Lovejoy LLP

[57] ABSTRACT

A method of fabricating an interpolysilicon dielectric structure in a non-volatile memory includes the steps of forming a high dielectric constant layer 12 on a floating gate 10 and an oxynitride layer 14 on the high dielectric constant layer 12. A control gate 18 may be formed on the oxynitride layer 14 to produce a dual gate structure with a high capacitance and therefore a high coupling ratio.

72 Claims, 3 Drawing Sheets

METHOD OF FABRICATING AN OXYNITRIDE-CAPPED HIGH DIELECTRIC CONSTANT INTERPOLYSILICON DIELECTRIC STRUCTURE FOR A LOW VOLTAGE NON-VOLATILE MEMORY

TECHNICAL FIELD

The present invention relates to a method of fabricating a dielectric structure in a non-volatile memory, and more particularly, to a method of fabricating a dielectric structure between floating and control gates in the non-volatile memory.

BACKGROUND ART

Non-volatile memories have been developed by the semiconductor integrated circuit industry for computer applications. Examples of non-volatile memory devices include conventional flash electronically erasable programmable read-only memories (EEPROMs). A typical non-volatile memory device is a dual gate device with a gate structure that generally includes a thin tunnel oxide layer between a source and a drain on a substrate, a polysilicon floating gate on the tunnel oxide layer, a dielectric stack on the floating gate, and a polysilicon control gate on the dielectric stack. The floating gate and the control gate, which are separated by the interpolysilicon dielectric stack, form a capacitor with a capacitance which is approximately directly proportional to the dielectric constant of the dielectric stack and approximately inversely proportional to the thickness of the dielectric stack.

During the operation of the non-volatile memory, a program or erase voltage is applied to the control gate, depending upon whether the presence of a voltage at the control gate signifies a program or erase. A voltage at the floating gate is induced by the voltage at the control gate through the capacitor formed by the dielectric stack between the floating and control gates. The ratio of the voltage induced at the floating gate to the voltage applied to the control gate is called the coupling ratio of the non-volatile memory. A conventional non-volatile memory device, for example, a NAND flash memory device, typically requires an operating voltage on the order of about 20 volts applied to the control gate to induce a sufficient voltage at the floating gate because the conventional device usually has a relatively small coupling ratio typically on the order of about 50%.

An example of a conventional interpolysilicon dielectric stack is a three-layer stack comprising a nitride layer sandwiched by two oxide layers. In general, conventional oxide and nitride materials have small dielectric constants although a nitride dielectric typically has a dielectric constant greater than that of an oxide dielectric. In a conventional non-volatile dual gate memory employing an oxide-nitride-oxide (ONO) dielectric stack as the interpolysilicon structure between the floating and control gates, the coupling ratio can be as low as 50% because of the low dielectric constants of the oxide and nitride layers. The coupling ratio of the non-volatile memory device is largely dependent upon the capacitance of the capacitor formed by the floating and control gates separated by the interpolysilicon dielectric stack. Although the capacitance and therefore the coupling ratio can be increased by decreasing the thickness of the ONO dielectric stack, the minimum thickness of the ONO dielectric stack is limited by existing processing technology. A very thin ONO dielectric stack usually has a poor data retention resulting in a low yield. A thick dielectric stack would improve the yield of the non-volatile memory devices, but it would decrease the coupling ratio, thereby necessitating a corresponding increase in the operating voltage, which is the program or erase voltage applied to the control gate. A high program or erase voltage at the control gate may be undesirable in that it may require an upconverted voltage power supply.

Therefore, there is a need for an interpolysilicon dielectric structure between the polysilicon floating and control gates with a large capacitance and therefore a large coupling ratio, to obviate the need for a high program or erase voltage to be applied to the control gate. Furthermore, there is a need for a method of fabricating a low voltage non-volatile memory device with a high yield.

DISCLOSURE OF THE INVENTION

The present invention satisfies these needs. In accordance with the present invention, a method of fabricating a dielectric structure in a non-volatile memory generally comprises the steps of:

(a) providing a first polysilicon layer as a floating gate;

(b) providing a high dielectric constant layer on the first polysilicon layer; and (c) forming an oxynitride layer on the high dielectric constant layer.

A second polysilicon layer can be formed on the oxynitride layer to serve as a control gate. The high dielectric constant layer may be made of tantalum oxide ($Ta_2O_5$), titanium oxide ($TiO_2$) or other appropriate high dielectric constant materials. The step of forming the oxynitride layer on the high dielectric constant layer may be achieved by a chemical vapor deposition or a plasma deposition. The high dielectric constant layer is heated to remove any carbon content from the high dielectric constant layer. For example, the high dielectric constant layer may be annealed in an oxygen ambient such that the carbon content in the high dielectric constant layer is oxidized and combusted out of the layer. The oxynitride layer protects the underlying first polysilicon layer from oxidation when the high dielectric constant layer is being annealed, thereby retarding the growth of an oxide layer on the floating gate.

Advantageously, the present invention provides a method of fabricating a dielectric structure with a high dielectric constant to improve the coupling ratio over that which can be achieved by conventional interpolysilicon dielectric structures, thereby obviating the need for a high program or erase voltage to be applied to the control gate. Another advantage of the invention is that it allows a relatively thick dielectric structure to be produced between the floating and control gates while maintaining a large capacitance which results in a high coupling ratio, thereby enabling the low voltage non-volatile memory to be fabricated with a high yield.

BRIEF DESCRIPTION OF THE DRAWINGS

The present invention will be described with respect to particular embodiments thereof, and references will be made to the drawings in which.

MODES FOR CARRYING OUT THE INVENTION

The present invention provides a method of making an interpolysilicon dielectric structure in a non-volatile memory that is able to provide a large capacitance and therefore a high coupling ratio to allow the memory to be operated with low program or erase voltages. Moreover, the method according to the present invention allows the dielectric structure to be fabricated with a greater thickness than that of a conventional interpolysilicon dielectric structure while still providing a high coupling ratio, thereby allowing the low voltage non-volatile memory to be produced with a high yield.

Figure 1:
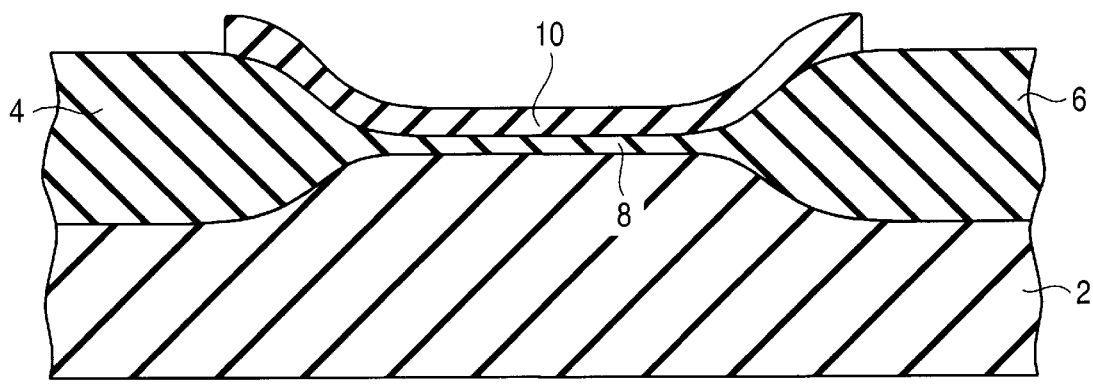
FIG. 1 is a sectional view of a portion of a non-volatile memory device with a floating gate on a tunnel oxide.

FIG. 1 is a sectional view of a partially fabricated non-volatile memory device with a silicon substrate 2, a field oxide layer with first and second portions 4 and 6 connected by a thin layer of tunnel oxide 8 on the substrate 2, and a first polysilicon layer 10, which serves as a floating gate for the non-volatile memory. The field oxide portions 4, 6 and the tunnel oxide 8 comprise silicon dioxide ($SiO_2$) as an integral layer, with the tunnel oxide 8 having a thickness much less than that of the field oxide portions 4 and 6. The fabrication of the silicon substrate 2, the field oxide portions 4, 6 and the tunnel oxide 8 is conventional and known to a person skilled in the art.

The first polysilicon layer 10 is then formed on the field oxide 4, 6 and the tunnel oxide 8 by conventional deposition, patterning and etching, such as by using a conventional photoresist and a conventional etching process such as a plasma etch to remove portions of the first polysilicon layer from the surfaces of the field oxide portions 4 and 6 while retaining a portion 10 of the first polysilicon layer on the tunnel oxide 8. The first polysilicon layer on the tunnel oxide 8 serves as a floating gate 10 in the non-volatile memory. The process of depositing, patterning and etching the first polysilicon layer to form the floating gate 10 is conventional and known to a person skilled in the art.

Figure 2:
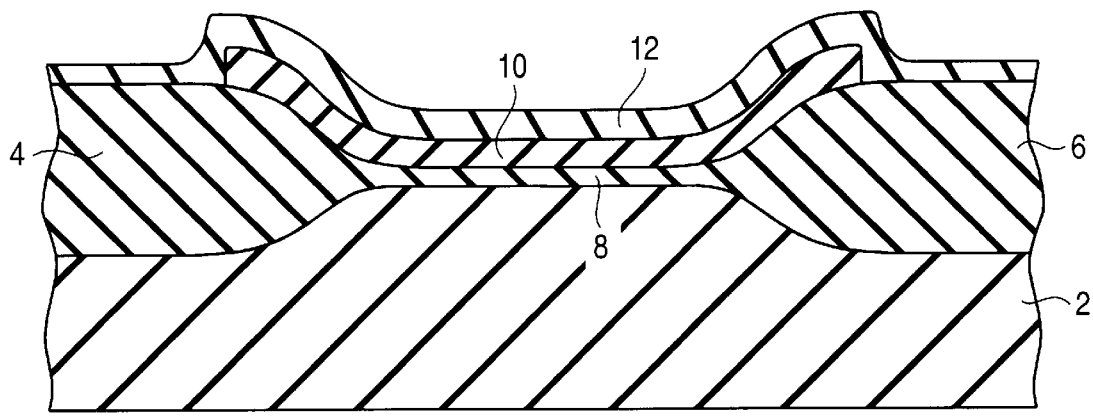
FIG. 2 is a sectional view of the non-volatile memory device of FIG. 1 with a high dielectric constant layer on the floating gate.

FIG. 2 is a sectional view of the non-volatile memory of FIG. 1 with a high dielectric constant layer 12 deposited on the surfaces of the floating gate 10 and the field oxide portions 4 and 6. Examples of high dielectric constant materials suitable for application as the high dielectric constant layer 12 in the interpolysilicon dielectric structure include tantalum oxide ($Ta_2O_5$) and titanium oxide ($TiO_2$). Depending upon conditions under which the high dielectric constant layer 12 is formed and the material which is used for the high dielectric constant layer 12, the dielectric constant may range from about 20 to about 85, which is much larger than the dielectric constants of conventional oxide and nitride materials roughly in the range of about 3–8. Therefore, the capacitance resulting from the dielectric structure fabricated according to the method of the present invention can be several orders of magnitude greater than conventional oxide or nitride based interpolysilicon dielectric structures. The deposition of the high dielectric constant layer 12 may be achieved by conventional methods of deposition known to a person skilled in the art, such as a chemical vapor deposition. Moreover, the high dielectric constant layer 12 can be relatively thick and still maintain a high capacitance, thereby allowing the low voltage non-volatile memory to be fabricated with a relatively high yield. For example, the high dielectric constant layer 12 may have a thickness in the range of about 300–400 Å.

Figure 3:
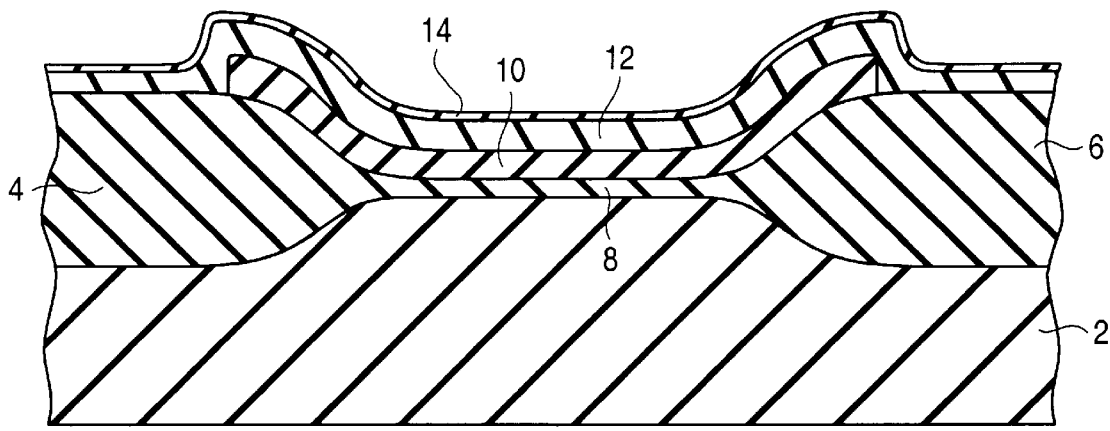
FIG. 3 is a sectional view of the non-volatile memory device of FIG. 2 with an oxynitride layer on the high dielectric constant layer.

Subsequent to the deposition of the high dielectric constant layer 12, an oxynitride layer 14 is formed on the surface of the high dielectric constant layer 12, as shown in FIG. 3. Only a thin layer of oxynitride 14, typically with a thickness of no more than 20 Å, need be deposited on the high dielectric constant layer 12. The oxynitride layer 14 may be as thin as 10 Å or less. The oxynitride layer 14 may be deposited on the high dielectric constant layer 12 by a chemical vapor deposition or a plasma deposition. The chemical vapor deposition may be desirable to produce a very thin oxynitride layer with a thickness of less than 20 Å.

Figure 4:
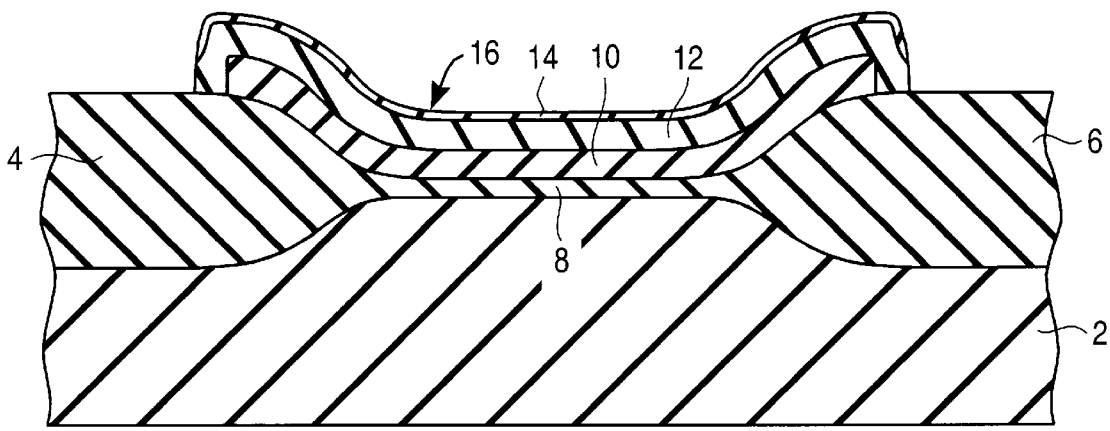
FIG. 4 is a sectional view of the non-volatile memory device of FIG. 3 with portions of the oxynitride and high dielectric constant layers etched to form an oxynitride-capped dielectric structure on the floating gate.

The portions of the oxynitride layer 14 and the high dielectric constant layer 12 on the field oxide portions 4 and 6 are then removed to form an oxynitride-capped dielectric structure 16 comprising the oxynitride layer 14 and the high dielectric constant layer 12 on the floating gate 10, as shown in FIG. 4. The oxynitride layer 14 and the high dielectric constant layer 12 may be selectively removed by conventional etching techniques such as plasma etching. For example, the non-volatile memory device may be patterned with a photoresist covering the portion of the oxynitride layer 14 on top of the floating gate 10 while exposing the portions of the oxynitride layer 14 on top of the field oxide portions 4 and 6. The portions of the oxynitride layer 14 and the underlying high dielectric constant layer 12 covering the field oxide portions 4 and 6 can then be removed by a plasma etch in a single etching step. Photoresist patterning and plasma etching are conventional processing methods known to a person skilled in the art. Other methods can also be used to form the oxynitride-capped dielectric structure 16 on the floating gate 10 in accordance with the present invention.

The high dielectric constant layer 12 is then heated to remove the carbon content from the high dielectric constant layer 12. In an embodiment, the high dielectric constant layer 12 is annealed in an oxygen ambient to combust the carbon out of the high dielectric constant layer 12. High dielectric constant materials such as $TiO_2$ and $Ta_2O_5$ may be provided in organic forms that may have carbon contents. For example, tantalum oxide, which has a formula of $Ta_2O_5$ in its pure form, may be deposited as an organic precursor $Ta(OC_2H_5)$, which has a significant residual carbon content, on the floating gate 10. The carbon in the organic compound is removed by the annealing of the high dielectric constant layer 12 in an ambient that causes the carbon in the organic compound to escape from the high dielectric constant layer 12. For example, an oxygen ambient may be used to oxidize the carbon content in the high dielectric constant layer 12 during the annealing process.

In conventional high dielectric constant material processing, the material is oxidized to combust the carbon content out of the organic material which has been deposited on the first polysilicon layer. In general, the oxidation of the high dielectric constant material can grow a thick oxide layer of as much as 40 Å on the first polysilicon layer. According to the present invention, the high dielectric constant layer 12 is covered by a thin oxynitride layer 14 to retard the oxidation of the floating gate 10 such that during the annealing of the high dielectric constant layer 12, the oxidation mostly occurs in the high dielectric constant layer 12 to remove its carbon contents while having a negligible effect on the underlying floating gate 10. With the retardation of the oxidation process by the oxynitride layer 14, the oxidation of the floating gate 10 is expected to be insignificant. A marginal growth of less than 10 Å of an oxide layer, if any, is expected in the floating gate 10 if the oxynitride layer 14 is formed on the high dielectric constant layer 12 prior to the annealing of the high dielectric constant layer 12 in an oxygen ambient.

Figure 5:
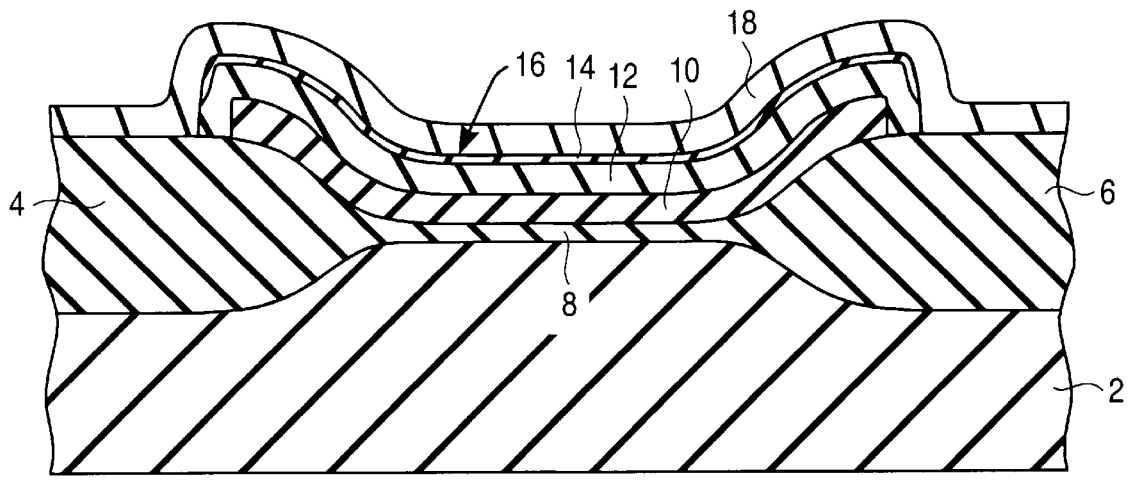
FIG. 5 is a sectional view of the non-volatile memory device of FIG. 4 with a second polysilicon layer deposited on the oxynitride layer and the field oxide portions.
Figure 6:
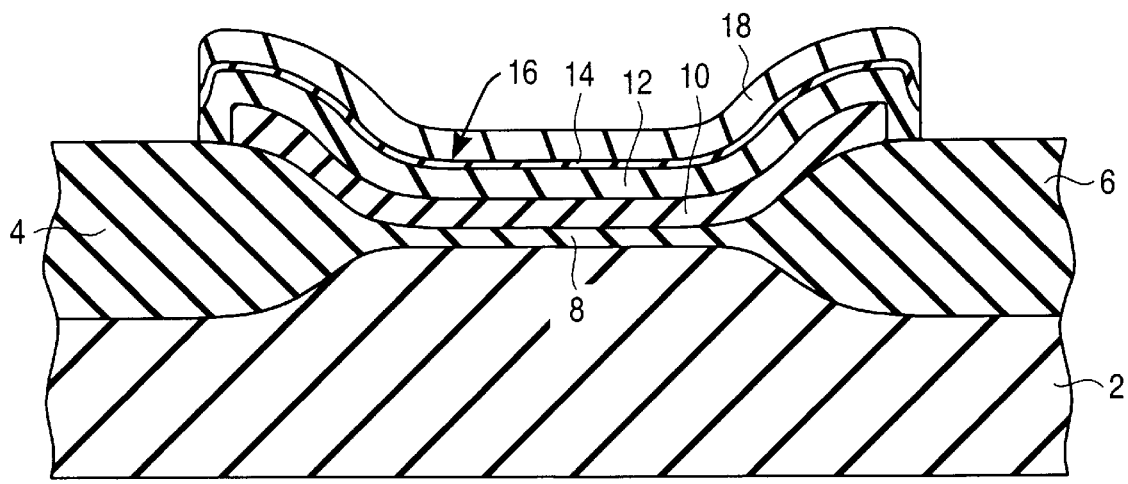
FIG. 6 is a sectional view of the non-volatile memory device of FIG. 5 with portions of the second polysilicon layer etched to form a control gate on the oxynitride layer.

FIG. 5 shows a sectional view of the non-volatile memory of FIG. 4 with a second polysilicon layer 18 deposited on the oxynitride-capped dielectric structure 16 and the field oxide portions 4 and 6. The portions of the second polysilicon layer 18 covering the field oxide layers 4 and 6 are removed by conventional etching methods such as plasma etching to form a control gate 18 on the oxynitride layer 14, as shown in FIG. 6. For example, the second polysilicon layer 18 of FIG. 5 may be patterned with a photoresist covering the portion of the second polysilicon layer 18 on top of the oxynitride-capped dielectric structure 16 while exposing the portions of the second polysilicon layer 18 on top of the field oxide portions 4 and 6. The second polysilicon layer 18 is then selectively etched to form the control gate 18 on the oxynitride-capped dielectric structure 16, as shown in FIG. 6.

An advantage of forming an oxynitride layer 14 on the high dielectric constant layer 12 is that it is able to retard the oxidation of the floating gate 10 when the high dielectric constant layer 12 is annealed in an oxygen ambient to remove the carbon content from the high dielectric constant layer 12 by oxidation. The carbon content in the high dielectric constant layer 12 can thus be removed without growing an appreciable oxide layer in the floating gate, thereby avoiding a decrease in the capacitance and hence the coupling ratio of the dual gate memory device. Another advantage of the present invention is that the high dielectric constant layer 12 is able to provide a high capacitance and therefore a high coupling ratio to the non-volatile memory device.

Industrial Applicability

The method according to the present invention is applicable for the fabrication of non-volatile dual memory devices including flash electronically erasable programmable read-only memory (EEPROM) devices and for the fabrication of other logic gate dielectric structures. The method is believed to be superior to conventional processing methods which typically produce interpolysilicon dielectric structures with a coupling ratio of about 50%, which usually necessitates an operating voltage of about 19–20 volts at the control gate. The method according to the present invention is expected to produce a dielectric structure resulting in a relatively high capacitance between the floating gate and the control gate, thus increasing the coupling ratio to 90% or above to enable the memory device to operate at a reduced program or erase voltage in the range of about 10–12 volts. Moreover, the great increase in the dielectric constant allows the dielectric structure to be much thicker while maintaining a high capacitance, thereby enabling the memory device to be fabricated with a high yield.

The invention has been described with respect to particular embodiments thereof, and numerous modifications can be made which are within the scope of the invention as set forth in the claims.

What is claimed is:

1. A method of fabricating a dielectric structure in a non-volatile memory, comprising the steps of:

(a) providing a first polysilicon layer;

(b) providing a high dielectric constant layer on the first polysilicon layer; and (c) forming an oxynitride layer on the high dielectric constant layer.

2. The method of claim 1, wherein the high dielectric constant layer includes carbon, further comprising the step of oxidizing the carbon in the high dielectric constant layer.

3. The method of claim 1, wherein the high dielectric constant layer includes carbon, further comprising the step of heating the high dielectric constant layer to remove the carbon from the high dielectric constant layer.

4. The method of claim 3, wherein the step of heating the high dielectric constant layer comprises the step of annealing the high dielectric constant layer.

5. The method of claim 1, wherein the high dielectric constant layer comprises $Ta_2O_5$.

6. The method of claim 1, wherein the high dielectric constant layer comprises $TiO_2$.

7. The method of claim 1, wherein the step of forming the oxynitride layer comprises the step of depositing the oxynitride layer on the high dielectric constant layer.

8. The method of claim 7, wherein the step of depositing the oxynitride layer comprises the step of chemical vapor depositing the oxynitride layer on the high dielectric constant layer.

9. The method of claim 7, wherein the step of depositing the oxynitride layer comprises the step of plasma depositing the oxynitride layer on the high dielectric constant layer.

10. The method of claim 7, wherein the step of forming the oxynitride layer further comprises the step of etching the oxynitride layer.

11. The method of claim 1, wherein the step of providing the high dielectric constant layer comprises the step of depositing the high dielectric constant layer on the first polysilicon layer.

12. The method of claim 11, wherein the step of providing the high dielectric constant layer further comprises the step of etching the high dielectric constant layer.

13. The method of claim 1, further comprising the step of forming a second polysilicon layer on the oxynitride layer.

14. The method of claim 13, wherein the step of forming the second polysilicon layer comprises the step of depositing the second polysilicon layer on the oxynitride layer.

15. The method of claim 14, wherein the step of forming the second polysilicon layer further comprises the step of etching the second polysilicon layer.

16. A method of fabricating a dielectric structure in a non-volatile memory, comprising the steps of:

(a) providing a floating gate;

(b) providing a high dielectric constant layer on the floating gate; and (c) depositing an oxynitride layer on the high dielectric constant layer.

17. The method of claim 16, wherein the high dielectric constant layer includes carbon, further comprising the step of oxidizing the carbon in the high dielectric constant layer.

18. The method of claim 16, wherein the high dielectric constant layer includes carbon, further comprising the step of heating the high dielectric constant layer to remove the carbon from the high dielectric constant layer.

19. The method of claim 18, wherein the step of heating the high dielectric constant layer comprises the step of annealing the high dielectric constant layer.

20. The method of claim 16, wherein the high dielectric constant layer comprises $Ta_2O_5$.

21. The method of claim 16, wherein the high dielectric constant layer comprises $TiO_5$.

22. The method of claim 16, wherein the step of depositing the oxynitride layer comprises the step of chemical vapor depositing the oxynitride layer on the high dielectric constant layer.

23. The method of claim 16, wherein the step of depositing the oxynitride layer comprises the step of plasma depositing the oxynitride layer on the high dielectric constant layer.

24. The method of claim 16, further comprising the step of etching the oxynitride layer.

25. The method of claim 16, wherein the step of providing the high dielectric constant layer comprises the step of depositing the high dielectric constant layer on the first polysilicon layer.

26. The method of claim 25, wherein the step of providing the high dielectric constant layer further comprises the step of etching the high dielectric constant layer.

27. The method of claim 16, further comprising the step of forming a control gate on the oxynitride layer.

28. The method of claim 27, wherein the step of forming the control gate comprises the step of depositing the control gate on the oxynitride layer.

29. The method of claim 28, wherein the step of forming the control gate further comprises the step of etching the control gate.

30. A method of fabricating a dielectric structure in a non-volatile memory, comprising the steps of:
   (a) providing a floating gate;
   (b) depositing a high dielectric constant layer on the floating gate, the high dielectric constant layer including carbon;
   (c) removing the carbon from the high dielectric constant layer; and
   (d) forming an oxynitride layer on the high dielectric constant layer.

31. The method of claim 30, wherein the step of removing the carbon comprises the step of oxidizing the carbon in the high dielectric constant layer.

32. The method of claim 30, wherein the step of removing the carbon comprises the step of heating the high dielectric constant layer.

33. The method of claim 32, wherein the step of heating the high dielectric constant layer comprises the step of annealing the high dielectric constant layer.

34. The method of claim 30, wherein the high dielectric constant layer comprises $Ta_2O_5$.

35. The method of claim 30, wherein the high dielectric constant layer comprises $TiO_5$.

36. The method of claim 30, wherein the step of forming the oxynitride layer comprises the step of depositing the oxynitride layer on the high dielectric constant layer.

37. The method of claim 36, wherein the step of depositing the oxynitride layer comprises the step of chemical vapor depositing the oxynitride layer on the high dielectric constant layer.

38. The method of claim 36, wherein the step of depositing the oxynitride layer comprises the step of plasma depositing the oxynitride layer on the high dielectric constant layer.

39. The method of claim 36, wherein the step of forming the oxynitride layer further comprises the step of etching the oxynitride layer.

40. The method of claim 30, wherein the step of providing the high dielectric constant layer comprises the step of depositing the high dielectric constant layer on the first polysilicon layer.

41. The method of claim 40, wherein the step of providing the high dielectric constant layer further comprises the step of etching the high dielectric constant layer.

42. The method of claim 30, further comprising the step of forming a control gate on the oxynitride layer.

43. The method of claim 42, wherein the step of forming the control gate comprises the step of depositing the control gate on the oxynitride layer.

44. The method of claim 43, wherein the step of forming the control gate further comprises the step of etching the control gate.

45. A method of fabricating a dielectric structure in a non-volatile memory that includes a substrate, a tunnel oxide on the substrate and a floating gate on the tunnel oxide, the method comprising the steps of:
   (a) providing a high dielectric constant layer on the floating gate;
   (b) forming an oxynitride layer on the high dielectric constant layer; and
   (c) forming a control gate on the oxynitride layer.

46. The method of claim 45, wherein the high dielectric constant layer includes carbon, further comprising the step of oxidizing the carbon in the high dielectric constant layer.

47. The method of claim 45, wherein the high dielectric constant layer includes carbon, further comprising the step of heating the high dielectric constant layer to remove the carbon from the high dielectric constant layer.

48. The method of claim 47, wherein the step of heating the high dielectric constant layer comprises the step of annealing the high dielectric constant layer.

49. The method of claim 45, wherein the high dielectric constant layer comprises $Ta_2O_5$.

50. The method of claim 45, wherein the high dielectric constant layer comprises $TiO_5$.

51. The method of claim 45, wherein the step of forming the oxynitride layer comprises the step of depositing the oxynitride layer on the high dielectric constant layer.

52. The method of claim 51, wherein the step of depositing the oxynitride layer comprises the step of chemical vapor depositing the oxynitride layer on the high dielectric constant layer.

53. The method of claim 51, wherein the step of depositing the oxynitride layer comprises the step of plasma depositing the oxynitride layer on the high dielectric constant layer.

54. The method of claim 51, wherein the step of forming the oxynitride layer further comprises the step of etching the oxynitride layer.

55. The method of claim 45, wherein the step of providing the high dielectric constant layer comprises the step of depositing the high dielectric constant layer on the first polysilicon layer.

56. The method of claim 55, wherein the step of providing the high dielectric constant layer further comprises the step of etching the high dielectric constant layer.

57. The method of claim 45, wherein the step of forming the control gate comprises the step of depositing the control gate on the oxynitride layer.

58. The method of claim 57, wherein the step of forming the control gate further comprises the step of etching the control gate.

59. A method of fabricating a dielectric structure in a non-volatile memory that includes a substrate, a tunnel oxide on the substrate and a floating gate on the tunnel oxide, the method comprising the steps of:
   (a) depositing a high dielectric constant layer on the floating gate, the high dielectric constant layer including carbon;

(b) removing the carbon from the high dielectric constant layer;
(c) forming an oxynitride layer on the high dielectric constant layer; and
(d) forming a control gate on the oxynitride layer.

60. The method of claim 59, wherein the step of removing the carbon comprises the step of oxidizing the carbon in the high dielectric constant layer.

61. The method of claim 59, wherein the step of removing the carbon comprises the step of heating the high dielectric constant layer.

62. The method of claim 61, wherein the step of heating the high dielectric constant layer comprises the step of annealing the high dielectric constant layer.

63. The method of claim 59, wherein the high dielectric constant layer comprises $Ta_2O_5$.

64. The method of claim 59, wherein the high dielectric constant layer comprises $TiO_5$.

65. The method of claim 59, wherein the step of forming the oxynitride layer comprises the step of depositing the oxynitride layer on the high dielectric constant layer.

66. The method of claim 65, wherein the step of depositing the oxynitride layer comprises the step of chemical vapor depositing the oxynitride layer on the high dielectric constant layer.

67. The method of claim 65, wherein the step of depositing the oxynitride layer comprises the step of plasma depositing the oxynitride layer on the high dielectric constant layer.

68. The method of claim 65, wherein the step of forming the oxynitride layer further comprises the step of etching the oxynitride layer.

69. The method of claim 59, wherein the step of providing the high dielectric constant layer comprises the step of depositing the high dielectric constant layer on the first polysilicon layer.

70. The method of claim 69, wherein the step of providing the high dielectric constant layer further comprises the step of etching the high dielectric constant layer.

71. The method of claim 59, wherein the step of forming the control gate comprises the step of depositing the control gate on the oxynitride layer.

72. The method of claim 71, wherein the step of forming the control gate further comprises the step of etching the control gate.

* * * * *